(12) United States Patent
Black et al.

(10) Patent No.: US 9,119,026 B2
(45) Date of Patent: Aug. 25, 2015

(54) ENHANCED PILOT SIGNAL

(75) Inventors: Peter John Black, San Diego, CA (US); Qiang Wu, San Diego, CA (US); Roberto Padovani, San Diego, CA (US); Wanlun Zhao, San Diego, CA (US); Yeliz Tokgoz, San Diego, CA (US); Ayman Fawzy Naguib, Cupertino, CA (US); Pranav Dayal, San Diego, CA (US); Parag Arun Agashe, San Diego, CA (US); Naga Bhushan, San Diego, CA (US); Je Woo Kim, Cupertino, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1147 days.

(21) Appl. No.: 12/113,900

(22) Filed: May 1, 2008

(65) Prior Publication Data

US 2009/0124265 A1 May 14, 2009

Related U.S. Application Data

(60) Provisional application No. 60/939,035, filed on May 18, 2007, provisional application No. 60/978,068, filed on Oct. 5, 2007, provisional application No. 61/014,706, filed on Dec. 18, 2007, provisional application No. 61/038,660, filed on Mar. 21, 2008, provisional application No. 61/016,101, filed on Dec. 21, 2007.

(51) Int. Cl.
*H04J 3/14* (2006.01)
*H04W 4/02* (2009.01)
*H03M 1/18* (2006.01)
*H04L 27/26* (2006.01)

(52) U.S. Cl.
CPC ............... *H04W 4/02* (2013.01); *H03M 1/185* (2013.01); *H04L 27/261* (2013.01)

(58) Field of Classification Search
None
See application file for complete search history.

(56) References Cited

U.S. PATENT DOCUMENTS

| 4,829,593 | A |   | 5/1989  | Hara       |         |
|-----------|---|---|---------|------------|---------|
| 5,900,838 | A |   | 5/1999  | Khan et al.|         |
| 5,970,414 | A |   | 10/1999 | Bi et al.  |         |
| 5,974,323 | A | * | 10/1999 | Doner      | 455/447 |
| 6,021,330 | A |   | 2/2000  | Vannucci   |         |

(Continued)

FOREIGN PATENT DOCUMENTS

| CN | 1257387 A | 6/2000 |
|----|-----------|--------|
| CN | 1419752 A | 5/2003 |

(Continued)

OTHER PUBLICATIONS

International Search Report and Written Opinion—PCT/US2008/063800, International Search Authority—European Patent Office—Feb. 26, 2009.

*Primary Examiner* — Rhonda Murphy
(74) *Attorney, Agent, or Firm* — Linda G. Gunderson

(57) ABSTRACT

Briefly, in accordance with one embodiment, a method of transmitting signals is provided. Signal waveforms are transmitted from at least two respective sectors. The at least two respective sectors are from at least two different sets of a superset of sectors. The transmitted signal waveforms include signal waveforms at least nearly mutually orthogonal at least along a particular signal dimension. An advantage of such an embodiment, for example, is reduced signal interference.

65 Claims, 9 Drawing Sheets

(56) References Cited

U.S. PATENT DOCUMENTS

| | | |
|---|---|---|
| 6,295,024 B1 | 9/2001 | King et al. |
| 6,329,948 B1 | 12/2001 | Ishikawa |
| 6,353,744 B1 | 3/2002 | Wu et al. |
| 6,493,331 B1 | 12/2002 | Walton et al. |
| 6,545,997 B1 * | 4/2003 | Bohnke et al. ............ 370/347 |
| 6,590,881 B1 | 7/2003 | Wallace et al. |
| 6,831,957 B2 | 12/2004 | Chen |
| 6,888,805 B2 | 5/2005 | Bender et al. |
| 7,016,692 B2 | 3/2006 | Rajkotia |
| 7,471,241 B1 | 12/2008 | Yang |
| 7,519,136 B2 | 4/2009 | Qi et al. |
| 7,528,772 B2 | 5/2009 | Ruutu et al. |
| 7,565,125 B2 | 7/2009 | Audinot et al. |
| 7,570,962 B2 | 8/2009 | Chou |
| 7,580,482 B2 | 8/2009 | Endres et al. |
| 7,721,236 B2 | 5/2010 | Hwang et al. |
| 7,990,317 B2 | 8/2011 | Davis et al. |
| 8,068,056 B2 | 11/2011 | Wachter et al. |
| 8,094,595 B2 | 1/2012 | Montojo et al. |
| 8,174,446 B2 | 5/2012 | Davis et al. |
| 8,326,318 B2 | 12/2012 | Attar et al. |
| 8,514,988 B2 | 8/2013 | Wu et al. |
| 2001/0034236 A1 | 10/2001 | Tong et al. |
| 2002/0025822 A1 * | 2/2002 | Hunzinger ............ 455/456 |
| 2002/0065075 A1 | 5/2002 | Kangas et al. |
| 2002/0183075 A1 | 12/2002 | Fauconnier |
| 2003/0026225 A1 | 2/2003 | Ogino et al. |
| 2003/0112857 A1 | 6/2003 | Cleveland |
| 2003/0190919 A1 | 10/2003 | Niemenmaa |
| 2003/0214908 A1 | 11/2003 | Kumar et al. |
| 2004/0067759 A1 | 4/2004 | Spirito et al. |
| 2004/0072579 A1 | 4/2004 | Hottinen |
| 2004/0092233 A1 | 5/2004 | Rudrapatna |
| 2004/0132443 A1 | 7/2004 | Klein et al. |
| 2004/0135721 A1 | 7/2004 | Hoven et al. |
| 2004/0151264 A1 | 8/2004 | Montojo et al. |
| 2004/0166873 A1 | 8/2004 | Simic et al. |
| 2004/0203921 A1 | 10/2004 | Bromhead et al. |
| 2005/0054349 A1 | 3/2005 | Balachandran et al. |
| 2005/0062530 A1 | 3/2005 | Bardsley et al. |
| 2005/0101277 A1 | 5/2005 | Narayan et al. |
| 2005/0186948 A1 | 8/2005 | Gallagher et al. |
| 2005/0232199 A1 | 10/2005 | Liu et al. |
| 2006/0079193 A1 | 4/2006 | Sato et al. |
| 2006/0199577 A1 | 9/2006 | Ramakrishna et al. |
| 2006/0209670 A1 | 9/2006 | Gorokhov et al. |
| 2006/0280200 A1 | 12/2006 | Lane et al. |
| 2007/0004430 A1 | 1/2007 | Hyun et al. |
| 2007/0063897 A1 | 3/2007 | Matsuda |
| 2007/0135170 A1 * | 6/2007 | Khan et al. ............ 455/562.1 |
| 2007/0149217 A1 * | 6/2007 | Balachandran et al. ... 455/456.1 |
| 2007/0189282 A1 | 8/2007 | Lohr et al. |
| 2007/0229355 A1 | 10/2007 | Han et al. |
| 2007/0298793 A1 | 12/2007 | Dawson |
| 2008/0132247 A1 | 6/2008 | Anderson |
| 2008/0151743 A1 | 6/2008 | Tong et al. |
| 2008/0161011 A1 | 7/2008 | Babin et al. |
| 2008/0267137 A1 | 10/2008 | Dabak et al. |
| 2008/0274753 A1 | 11/2008 | Attar et al. |
| 2009/0003495 A1 | 1/2009 | Wu et al. |
| 2009/0203386 A1 | 8/2009 | Edge et al. |
| 2009/0280836 A1 | 11/2009 | Chou |
| 2010/0105405 A1 | 4/2010 | Vujcic |
| 2011/0111751 A1 | 5/2011 | Markhovsky et al. |
| 2013/0065610 A1 | 3/2013 | Attar et al. |
| 2013/0217401 A1 | 8/2013 | Edge et al. |
| 2014/0029705 A1 | 1/2014 | Wu et al. |
| 2014/0038645 A1 | 2/2014 | Wu et al. |
| 2014/0064243 A1 | 3/2014 | Ma et al. |

FOREIGN PATENT DOCUMENTS

| | | |
|---|---|---|
| CN | 1468023 A | 1/2004 |
| CN | 1926445 A | 3/2007 |
| EP | 0893920 A2 | 1/1999 |
| EP | 0893930 A2 | 1/1999 |
| EP | 1014103 | 6/2000 |
| EP | 1093318 A2 | 4/2001 |
| EP | 1043861 B1 | 6/2002 |
| JP | 5211470 A | 8/1993 |
| JP | 10285640 A | 10/1998 |
| JP | 11122656 A | 4/1999 |
| JP | 2000180186 | 6/2000 |
| JP | 2001051042 A | 2/2001 |
| JP | 2001083229 A | 3/2001 |
| JP | 2001177469 A | 6/2001 |
| JP | 2002516519 A | 6/2002 |
| JP | 2002281540 A | 9/2002 |
| JP | 2003047044 A | 2/2003 |
| JP | 2003078947 A | 3/2003 |
| JP | 2003520518 A | 7/2003 |
| JP | 2004512788 A | 4/2004 |
| JP | 2004253899 A | 9/2004 |
| JP | 2004535724 A | 11/2004 |
| JP | 2007020162 A | 1/2007 |
| JP | 2007529947 A | 10/2007 |
| JP | 2009521192 | 5/2009 |
| JP | 4809437 | 8/2011 |
| RU | 2286652 | 10/2006 |
| WO | WO9815149 A1 | 4/1998 |
| WO | WO9950968 A1 | 10/1999 |
| WO | 9960739 A1 | 11/1999 |
| WO | 0152566 | 7/2001 |
| WO | 0235877 A1 | 5/2002 |
| WO | WO0241509 | 5/2002 |
| WO | WO2007004788 A1 | 1/2007 |
| WO | WO2007013850 A2 | 2/2007 |
| WO | WO2007018408 A1 | 2/2007 |
| WO | WO2007025143 A1 | 3/2007 |
| WO | WO2007120326 A2 | 10/2007 |

* cited by examiner

310

410

510

910

ENHANCED PILOT SIGNAL

RELATED PATENT APPLICATIONS

This patent application claims priority to U.S. Provisional Patent Application Ser. No. 60/939,035, filed on May 18, 2007; U.S. Provisional Patent Application Ser. No. 60/978, 068, filed on Oct. 5, 2007; U.S. provisional patent application Ser. No. 61/014,706, filed on Dec. 18, 2007; U.S. Provisional Patent Application Ser. No. 61/038,660, filed on Mar. 21, 2008; U.S. Provisional Patent Application Ser. No. 61/016, 101, filed on Dec. 21, 2007;, all of the foregoing assigned to the assignee of currently claimed subject matter and herein incorporated by reference in their entirety. Furthermore, this patent application is being concurrently filed with U.S. patent application Ser. No. 12/113,903, titled "Enhanced Pilot Signal Receiver", filed on May 1, 2008, by Wu et al.; and U.S. patent application Ser. No. 12/113,810, titled "Position Location for Wireless Communications System", filed on May 1, 2008, by Attar et al.; both of which are assigned to the assignee of currently claimed subject matter and incorporated by reference in their entirety.

FIELD

This disclosure relates to enhanced pilot signals for use in wireless communications or other systems.

BACKGROUND

Mobile stations or other receivers, such as, for example, cellular telephones, are beginning to include the ability to gather information that provides the ability to estimate position of the mobile station or other receiver. To have this capability, a mobile device, for example, may receive signals from a satellite positioning system (SPS), such as, for example, a Global Positioning System (GPS). Such information, perhaps in conjunction with other received information, may be employed to estimate position location. A variety of scenarios in which a mobile station or receiver may estimate position location are possible.

However, for a variety of reasons, a mobile station may encounter difficulties in receiving signals. For example, difficulties may be experienced if the mobile station is positioned inside of a building, or in a tunnel, etc. In other circumstances, a mobile station may not include an SPS receiver. Again, a variety of scenarios are possible. However, due at least in part to difficulties related to the ability of a mobile station to receive signals enabling it to estimate position location, a need exists for alternate ways for a mobile station or other device to estimate position location.

SUMMARY

Briefly, in accordance with one embodiment, a method of transmitting signals is provided. Signal waveforms are transmitted from at least two respective sectors. The at least two respective sectors are from at least two different sets of a superset of sectors. The transmitted signal waveforms include signal waveforms at least nearly mutually orthogonal at least along a particular signal dimension. An advantage of such an embodiment, for example, is reduced signal interference.

BRIEF DESCRIPTION OF THE FIGURES

Non-limiting and non-exhaustive embodiments are described herein with reference to the following figures.

DETAILED DESCRIPTION

Figure 1:
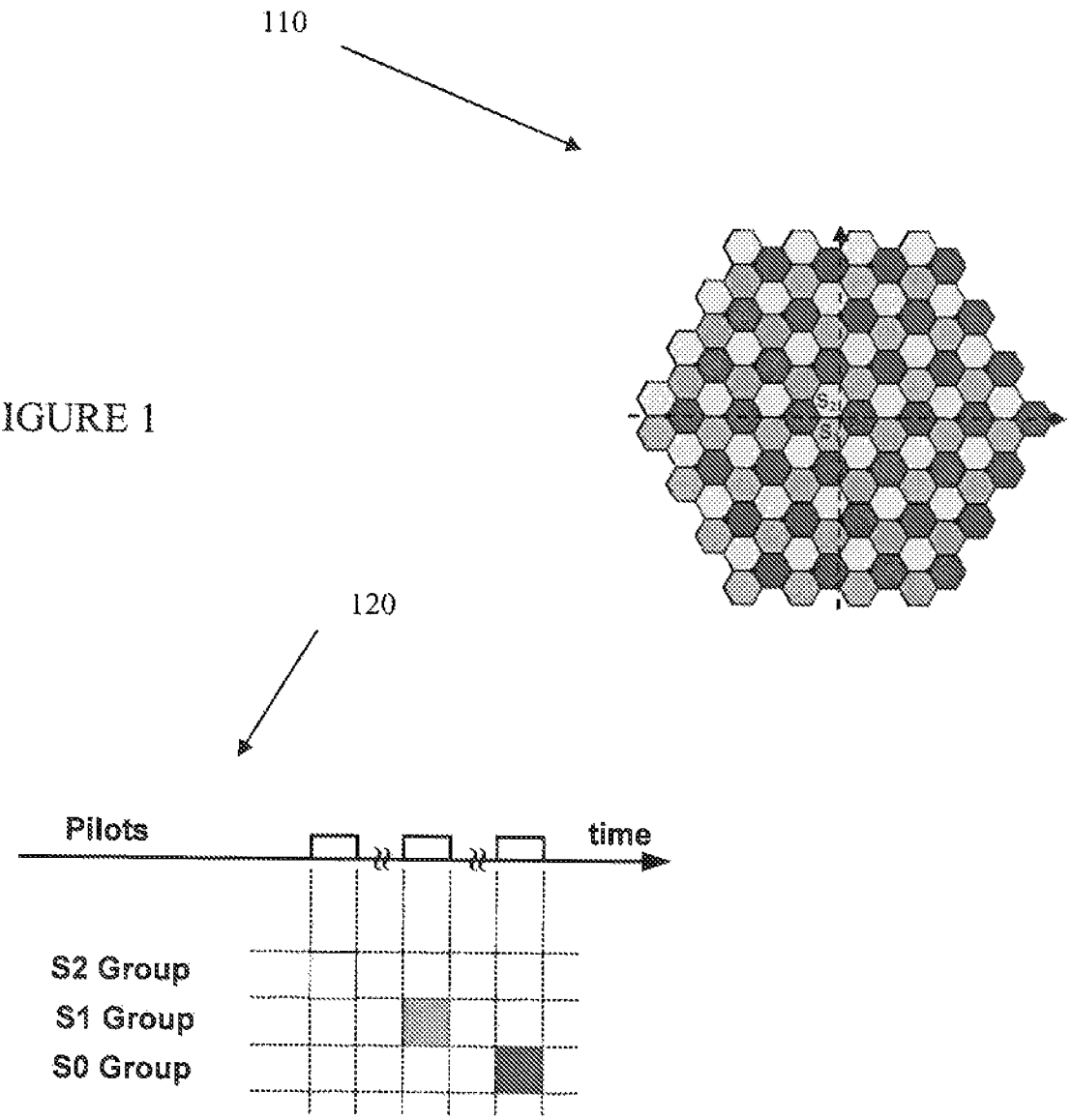
FIG. 1 is a schematic diagram illustrating an embodiment employing three time slots for enhanced pilot signaling.

In the following detailed description, numerous specific details are set forth to provide a thorough understanding of claimed subject matter. However, it will be understood by those skilled in the art that claimed subject matter may be practiced without these specific details. In other instances, methods, apparatuses or systems that would be known by one of ordinary skill have not been described in detail so as not to obscure claimed subject matter.

Reference throughout this specification to one implementation, an implementation, one embodiment an embodiment, or the like may mean that a particular feature, structure, or characteristic described in connection with a particular implementation or embodiment may be included in at least one implementation or embodiment of claimed subject matter. Thus, appearances of such phrases in various places throughout this specification are not necessarily intended to refer to the same implementation or to any one particular implementation described. Furthermore, it is to be understood that particular features, structures, or characteristics described may be combined in various ways in one or more implementations. In general, of course, these and other issues may vary with the particular context. Therefore, the particular context of the description or usage of these terms may provide helpful guidance regarding inferences to be drawn for that particular context.

Likewise, the terms, "and," "and/or," and "or" as used herein may include a variety of meanings that will, again, depend at least in part upon the context in which these terms are used. Typically, "and/or", as well as "or" if used to associate a list, such as A, B or C, is intended to mean A, B, or C, here used in the exclusive sense, as well as A, B and C. In addition, the term "one or more" as used herein may be used to describe any feature, structure, or characteristic in the singular or may be used to describe some combination of features, structures or characteristics.

Some portions of the detailed description which follow are presented in terms of algorithms or symbolic representations of operations on data bits or binary digital signals stored within a computing system memory, such as a computer memory. These algorithmic descriptions or representations encompass techniques used by those of ordinary skill in the data processing or similar arts to convey the substance of their work to others skilled in the art. An algorithm is here, and generally, considered to be a self-consistent sequence of operations and/or similar processing leading to a desired result. The operations and/or processing involve physical manipulations of physical quantities. Typically, although not necessarily, these quantities may take the form of electrical or magnetic signals capable of being stored, transferred, combined, compared or otherwise manipulated. It has proven convenient, at times, principally for reasons of common usage, to refer to these signals as bits, data, values, elements, symbols, characters, terms, numbers, numerals or the like. It should be understood, however, that all of these or similar terms are to be associated with the appropriate physical quantities and are intended to merely be convenient labels. Unless specifically stated otherwise, as apparent from the following discussion, it is appreciated that throughout this specification, discussions utilizing terms such as "processing", "computing", "calculating", "determining" or the like refer to the actions or processes of a computing platform, such as a computer or a similar electronic computing device, that manipulates or transforms data represented as physical electronic or magnetic quantities, or other physical quantities, within the computing platform's memories, registers or other information storage, transmission, or display devices.

As previously indicated, a need exists for ways of estimating position location for a mobile station or other device. Although receiving satellite signals, as previously indicated, provides one approach; other approaches that may either supplement such signals or be employed instead of such an approach remain desirable.

In this context, the term mobile station is meant to refer to any device having the ability to receive wireless signals and send wireless signals, which is also capable of being mobile with respect to position location. A mobile station typically will receive signals in connection with usage as part of a wireless communications system. Furthermore also typically, but not necessarily, a mobile station may communicate with one or more cells in a wireless communication system. Typically, such cells may comprise base stations. Therefore, it may be desirable for information gathered via base station communications to be utilized by a mobile station, sometimes referred to as a mobile, in estimating position location. Likewise, as indicated above, such information may supplement information available through other mechanisms, such as via satellite or via a position determining entity (PDE), for example.

However, a mobile station in communication with one or more base stations to gather information may encounter difficulties in some circumstances due to, for example, interference. For example, interference may occur between signals transmitted by several base stations. Thus, in this example, a mobile station may not be able to adequately communicate with one or more of the base stations, resulting in an inability or a reduced ability to perform an accurate position location estimate. This is sometimes referred to as the "hearability problem" due at least in part to the "near-far effect". For example, for wireless communications systems, such as cdma2000 and WCDMA, to provide without limitation only a few possible examples, downlink pilot signals may be difficult to detect due at least in part to such interference Although claimed subject matter is not limited in scope to any particular embodiment, in a variety of example embodiments, an approach to signal communications may be discussed to address at least in pad the issues discussed above. In descriptions of such example embodiments, aspects of the signaling may relate to the time domain, the frequency domain or to other aspects of a particular signal, referred to here as signal dimensions. Nonetheless, it is intended that claims subject matter not be limited in scope to signaling in these example domains or signal dimensions. These examples are merely illustrative. For example, in other embodiments, instead of time or frequency, other dimensions of a signal may be involved, such as, for example, phase, amplitude, spreading code or spreading code sequence, signal energy or any combinations thereof. In this context, the term signal dimension is intended to refer to a quantifiable aspect of a signal that may vary across a variety of signals and that may be used to categorize or partition signals which vary from one another in this particular quantifiable aspect. Claimed subject matter is not intended to be limited to the specific example embodiments discussed. Rather, many other signaling techniques or signaling approaches that employ other signal dimensions are included within the scope of claimed subject matter. It is intended that the scope of claimed subject matter include all such techniques and approaches.

In one particular embodiment of a method of transmitting signals, for example, signal waveforms may be transmitted from at least two respective sectors of a wireless communications system. The at least two respective sectors, likewise, may be from at least two different sets of a superset of sectors. For example, a superset of sectors, such as illustrated in FIG. 1, as an example, may be divided into at least two, and as illustrated in FIG. 1, in some embodiments, more than two sets of sectors. Thus, in this particular embodiment, the sectors transmitting signals may be from separate sets of sectors. Likewise, in this particular embodiment, the signal waveforms transmitted may be at least nearly mutually orthogonal, at least along a particular signal dimension, such as, for example, time or frequency, as shall be discussed below in more detail. Although an implementation in which a single base station or sector transmits a location pilot during a particular time slot or other dimension provides the ability of a mobile station to discern signal characteristics, it likewise increases the time to acquire information from a desired number of base stations. Therefore, some implementations may implement reuse techniques. Cell sectors can be arranged as groups or sets, and different groups may transmit location pilots during different dedicated signal dimensions, such as different time slots, for example, for time multiplexed signals.

FIG. 1, for example, instead, illustrates an embodiment in which a superset of sectors are partitioned or divided into 3 sets, S0, S1, and S2, although, of course, claimed subject matter is not limited in scope in this respect. The arrangement of sectors is illustrated by 110 and the particular time slots in which those sectors may transmit enhanced pilot signals is illustrated by 120. As indicated above, this approach could be applied to a variety of signal dimensions, such as, for example time and/or frequency, to provide only two out of more than two possible examples. However, for ease of explanation, we shall illustrate an example embodiment for the protocol 1xEV-DO, which employs uplink and downlink signal transmissions in which information is slotted into various time slots.

Protocol 1xEV-DO is part of a family of CDMA2000 1x digital wireless standards. 1xEV-DO is a third generation or "3G" CDMA standard. There are currently two main versions of 1xEV-DO: "Release 0" and "Revision A". 1xEV-DO is based on a technology initially known as "HDR" (High Data Rate) or "HRPD" (High Rate Packet Data), developed by Qualcomm. The international standard is known as IS-856.

Figure 2:
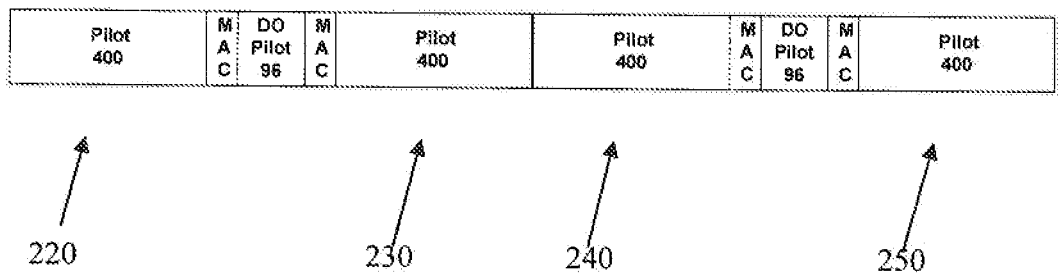
FIG. 2 is a schematic diagram of an embodiment of a slot of a time division multiplexed signal transmission, such as may be employed in 1xEV-DO, for example, to implement enhanced pilot signaling.

FIG. 2 is one possible example embodiment 210 of a time division multiplexed (TDM) signal that may employ enhanced pilot signaling, although, of course, claimed subject matter is not limited in scope to this particular example.

Embodiment 210 is intended to illustrate one enhanced pilot signal slot. In the 1xEVDO downlink, a Pilot Channel is time division multiplexed with other channels. The Pilot Channel in this example is designated by 210-250. A 1xEV-DO downlink transmission includes time slots of length 2048 chips. Groups of 16 slots align with an offset pseudo-random noise or PN sequence. As illustrated by 210, within a slot, Pilot, enhanced media access control (MAC) and Traffic or Control Channels are time division multiplexed. Thus, for an embodiment of enhanced pilot signaling for a 1xEV-DO downlink, time slots may be allocated for enhanced pilot signals. Here, FIG. 2 illustrates one possible embodiment of such a slot structure, although, for course, claimed subject matter is not limited in scope to this example. Many other possible enhanced pilot signal configurations or structures are possible and are included within the scope of claimed subject matter.

For this embodiment, however, enhanced pilot channels or signals are transmitted in the data portion of these dedicated slots, while legacy Pilot and MAC channels are retained for backward comparability. For this embodiment, the enhanced pilot may appear as an unintended packet for legacy mobile stations, for example, that would not have the ability to recognize it. Likewise, for this embodiment, this slot may be transmitted with a relatively low "duty cycle", such as around 1% and still provide signaling benefits. In this way, potential impact on downlink capacity may not be significant.

An aspect of embodiments in accordance with claimed subject matter, such as the embodiment just discussed, relates to so called "reuse". This term refers to the concept that signaling resources, such as frequency bandwidth or signal duration, for example, that may be available in a particular signaling dimension (or in several signaling dimensions in some embodiments) may be employed (or reemployed) by other or different sectors. For example, in the embodiment described above, dedicated time slots may be partitioned to correspond, for example, to the sets of sectors illustrated in FIG. 1. In this example, 3 non-overlapping partitions have been formed, although claimed subject matter is not limited in scope in this respect. Any number of groups, referred to here as K or as reuse factor 1/K may be employed and the sectors are not required to be non-overlapping. However, regardless of the details of this particular embodiment, a one-to-one association, by construction, may exist between the partitions of the dedicated time slots and the partitions of the sets of sectors of the superset. Sectors of a particular set may only transmit enhanced pilot signals in its associated slots. This is referred to as reuse over time, here, since in this embodiment signaling resources available along the time signaling dimension have been partitioned to correspond to the partitioned sets of sectors that together comprise the superset of sectors.

One advantage of the approach of this particular embodiment, as suggested previously, relates to a reduction in signal transmission interference. In other words, by partitioning sectors along a signal dimension so that the transmitted signal waveforms are nearly mutually orthogonal results in pilot signals that are more easily detected by a mobile station, for example.

Partitioning of sectors for ease of discussion may be referred to here as "coloring," although the use "colors" is, of course, not a necessary feature of claimed subject matter or even of this particular embodiment. Rather, the term "color" is intended here to identify partitions or partitioning. Thus, as described in more detail immediately below, "color" here, which merely designates a partition, which for a sector, for example, refers to a 2tuple, rather than the conventional notion of color. For example, and without limitation, if we let a cell take on a value from the set {Red, Green, Blue} (abbreviated as {R, G, B}), a sector may, in this example, take on a value from the set {R, G, B}×{α, β, γ}, where "x" stands for Cartesian product. Thus, in this example, the "color" of the cell influences the "color" of the sectors of that cell. Of course, it is appreciated that claimed subject matter is not necessarily restricted to partitioning by cells or sectors. For example, in alternative embodiments, other subdivisions or partitions may be employed. However, as indicated above, the color of a sector may be referred to as a 2tuple, for example (R, α) abbreviated as Rα, the first element, again, coming from the color of the cell to which the sector belongs. Based at least in part on the discussion above, it should now be apparent that the reuse factor for this particular example is K=9 or ⅑.

Figure 3:
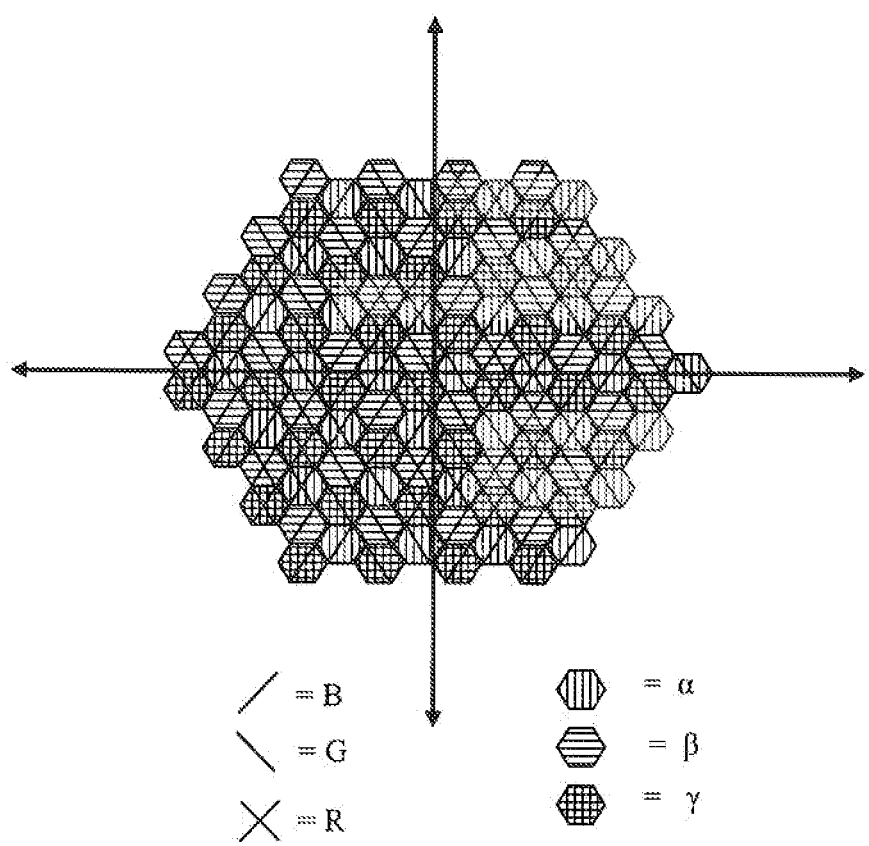
FIG. 3 is a schematic diagram illustrating an embodiment employing nine time slots for enhanced pilot signaling.
Figure 6:
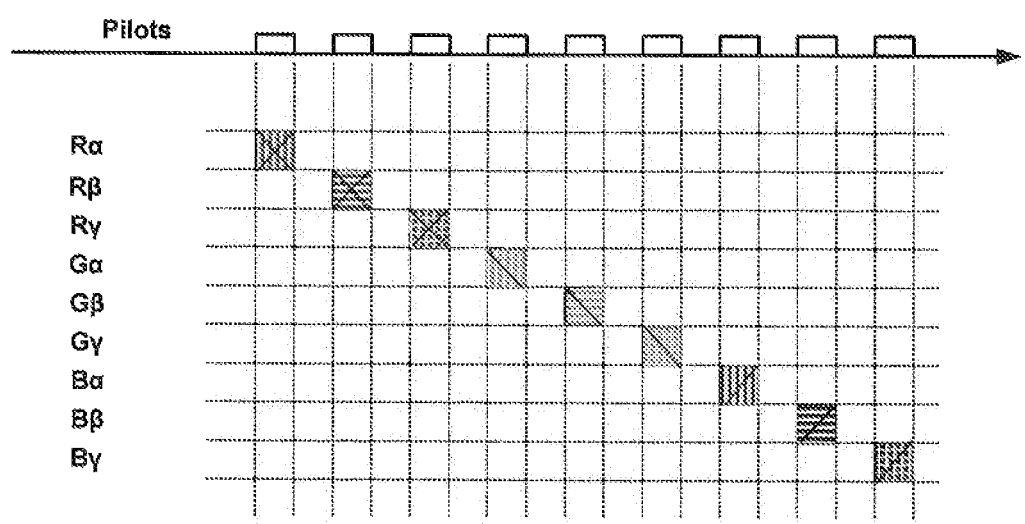
FIG. 6 is a table associated with the embodiment shown in FIG. 3.

An example embodiment 310 is shown in FIG. 3 that differs from the embodiment shown in FIG. 1. FIG. 3 also illustrates an example of planned or dedicated coloring. For the particular embodiment being discussed, transmitted signal waveforms comprise time division multiplexed (TDM) signal waveforms, as illustrated by 610 in FIG. 6. In planned coloring, colors are assigned in a fixed or dedicated manner so as to reduce interference among sectors of the same color in a balanced way, although, of course, claimed subject matter is not limited in scope to employing such an approach. Thus, as is illustrated by FIGS. 3 and 6, signals are transmitted in particular time slots so that potential signal interference is reduced. As may now be appreciated from the above discussion, dedicated resource and reuse reduces inter-channel interference, and thus assists to mitigate the near-far effect and likewise improve hearability. Therefore, for this particular embodiment at least, the TDM signal waveforms that are transmitted in dedicated time slots associated with particular cell sectors comprise highly detectable pilot (HDP) signals. As shall be discussed further below, this allows for improved terrestrial position location estimation accuracy, although, again, claimed subject matter is not limited in scope in this respect.

Another advantage of the embodiment described above, although claimed subject matter is not limited in scope in this respect, is the opportunity to implement a feature referred to in this particular context as incremental detection. Incremental detection here refers to the ability of a receiver portion of a mobile station to engage in a real-time trade-off between time and location position estimate accuracy by waiting to receive additional enhanced pilot signals that may improve position location accuracy.

For example, as described in connection with the example embodiment above, a mobile station that receives transmitted signal waveforms which include enhanced pilot signaling for one of 9 groups or sets of sectors has an option to wait to receive additional time slots which may include enhanced pilot signals for other groups or sets of sectors before computing a position location estimate. However, depending at least in part on a variety of factors, which may include the particular application, for example, a mobile station nonetheless may, if it is determined to be desirable, estimate position location without waiting to receive additional signals, thereby giving up additional "hearability" for less delay. The mobile station may more accurately estimate position location by receiving and processing additional enhanced pilot signals from other sectors of other sets or groups. For the embodiment illustrated in FIG. 6, as simply one example, without limitation, the mobile station or other receiver may perform a "position fix" by estimating location positions after receiving ⅓, ⅔ or all of the time slots dedicated to enhanced pilot signals in this particular embodiment. A longer delay before processing the signals should in general correspond to more detected base stations and, therefore, provide incrementally better detection estimates.

Although claimed subject matter is not limited in scope in this respect, for some embodiments, it may be desirable if the trade off described above were graceful or smooth. In one such embodiments such as the embodiment shown in FIG. 3, again without limitation, a mobile station may be able to detect a reasonable number of base stations from all directions at relatively early times as a result of a particular transmission order employed. For example, a grouping or transmission strategy may be designed to allow a mobile station to detect base stations from different directions for particular amounts of delay. For example, for a group, the distribution of base stations about a particular point may be said to be radially symmetric. In the context of an assembly of base stations, a variation from strict radial symmetry may be expected, of course. Thus, a configuration need not be radially symmetric at all times, but may be approximately radially symmetric if averaged over time. Nonetheless, other embodiments other than the embodiment shown in FIG. 6 are possible and are intended to be included within the scope of claimed subject matter. Furthermore, claimed subject matter is intended to also cover those embodiments in which the trade-off may not be smooth or graceful or in which no trade off occurs.

For dedicated or planned coloring, it may be possible for the system or network to inform the mobile stations or terminals regarding the particular "color map". Alternatively, perhaps information may be loading in memory of a mobile station before the mobile station is deployed or perhaps a mobile station may determine the color map with respect to neighboring sectors through enhanced pilot signal detection over time. To reduce potential interference, it may, in at least some embodiments, be desirable that a sector or cell not share the same color with an immediately neighboring sector or cell. Likewise, if two neighboring sectors share the same PN sequence, it may assist in resolving ambiguity, in situations in which a mobile station may detect both sectors, if they do not share the same color, although, of course, claimed subject matter is not limited in scope in this respect.

Figure 4:
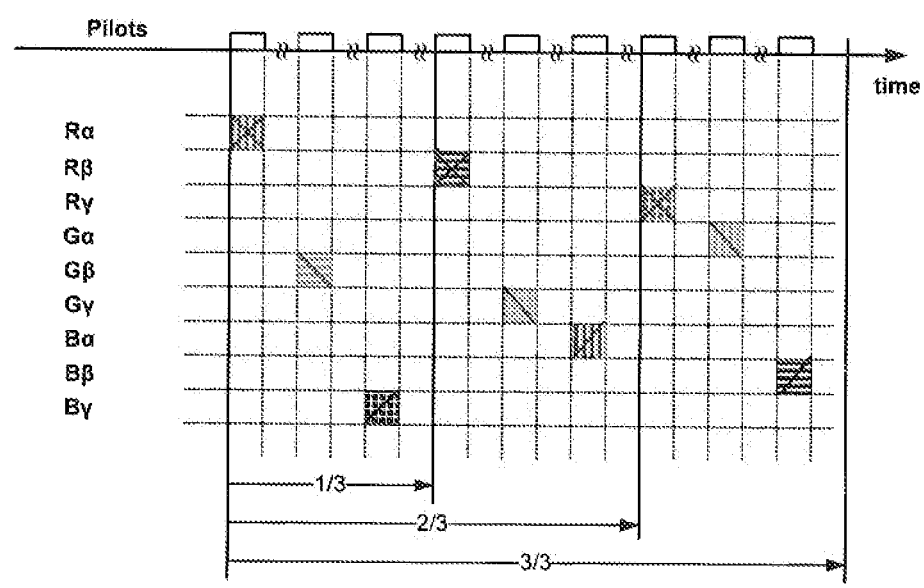
FIG. 4 is a schematic diagram illustrating another embodiment employing nine time slots for enhanced pilot signaling
Figure 5:
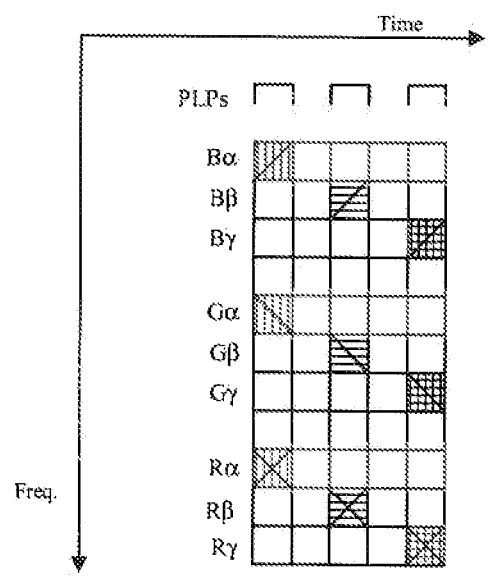
FIG. 5 is a schematic diagram illustrating an embodiment employing nine time-frequency slots for enhanced pilot signaling.

FIG. 4 is a schematic diagram illustrating embodiment 410, one of many possible embodiments in accordance with claimed subject matter that may be employed to provide enhanced pilot signals for 1xEV-DO. Here, color assignments are made to reduce interference among sectors of the "same color" in a balanced way, as suggested previously, for example. This particular embodiment employs planned or dedicated coloring, although, as made clear previously, claimed subject matter is not limited in scope to dedicated coloring. As shall be described in more detail below, other approaches may be employed within the scope of claimed subject matter.

Figure 9:
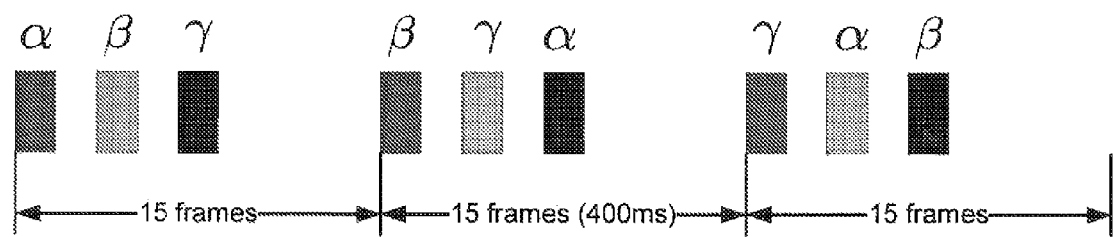
FIG. 9 is a schematic diagram illustrating an embodiment employing bursty time slot transmissions for enhanced pilot signaling.

Nonetheless, continuing with this particular embodiment, as illustrated in FIG. 9, three time slots may be reserved for every 256 time slots, resulting in an overhead of around 1%, as had been suggested previously. Slots 910 may be transmitted consecutively in one interlace, like a 3-slot packets, for example, although, of course, claimed subject matter is not limited in scope to "bursty" transmissions for enhanced pilot signaling. For example, a mobile station in an idle state may quickly leave the idle state to process such a burst and then go back to idle, potentially resulting in better detection power efficiency.

For this particular embodiment, a burst sequence is Red, Green, Blue, although, as illustrated, α, β, and γ, change on successive bursts. Likewise, for this particular embodiment, a burst of 3 time slots cyclically shifts after 768 slots, although claimed subject matter is not limited in scope in this respect. An advantage of such an approach, however, is to resolve possible ambiguity that might occur in some situations. If, for example, a receiver can only detect enhanced signal pilots from one sector, without a cyclic shift, an ambiguity about which dedicated slot is being detected could be present.

Another possible feature that may accompany this particular embodiment would be to transmit these enhanced pilot signals with over-boosted power. This may lead to improved coverage; however, extra distortion is not likely since these times slots have a low peak to average power ratio. Likewise, it may be beneficial to code enhanced pilot signals using ma different PN sequence than is used to code non-enhanced signals, such as DO pilot signals. One approach, without limitation, that may be relatively convenient to implement may involve using the PN sequence that corresponds to the complex conjugate of the sequence being applied by the base station to non-enhanced signals.

While dedicated or planned coloring provides potential advantages some of which are discussed above, color assignment to reduce interference among sectors may involve some amount of planning effort. If it were possible to reduce or avoid this effort, it may in some situations be advantageous. One approach may be to employ what may be referred to here as time varying coloring, rather than dedicated coloring. In time varying coloring, the color of various sectors may change with time. However, color assignment and/or transmission order may nonetheless be deterministic or non-deterministic (e.g., random or quasi-random). Thus, in some implementations for example, color assignments for base stations may be fixed with transmission order being varied. Further, transmission order may change over time in a pre-determined way, or in a pseudo-random way. However, in other implementations, transmission order may be fixed with color assignments being varied. Here, again, color assignments may change in a pre-determined way, or in a pseudo-random way.

For example, again, but without limitation, for ease of discussion, assume a system employs time multiplexed signals, although, as previously indicated, many other approaches may be employed, such as FDM, OFDM, etc. Also, assume such a system may employ a non-dedicated scheme, such as a random or time-varying scheme. In a non-dedicated scheme employing random coloring, for example, a pseudo-random process may be employed to make color assignments to sectors, for this particular embodiment, for example. Likewise, if the mobile station has the particular pseudo-random process and the initial seed, for example, it may determine the particular association at any given point. Thus, enhanced pilot signals corresponding to sectors of interest may be detected by time slot, thereby reducing computational complexity for the mobile station. It is worth noting here, that for some embodiments, it may be desirable for two sectors capable of being detected by a mobile station sharing a PN sequence to not share the same seed. This may resolve ambiguity in situations in which the mobile station may detect both sectors. Of course, a similar pseudo-random approach as just described may likewise be employed in an embodiment in which the enhanced pilot signals are FDM signals, for example. Again, by applying the same pseudo-random process starting with the same seed, for example, the mobile station is able to determine the selected frequencies corresponding to selected sectors of interest and check those frequencies as part of a signal detection process, thereby reducing processing to perform such computations.

One particular example of random coloring is described in more detail below. In this particular embodiment, colors of various sectors are assigned pseudo-randomly. Thus, here, for this particular embodiment, the color of a sector varies with time in a pseudo-random manner, where here the term color refers to the 2tuple discussed previously. For example, assume, as previously, that an enhanced pilot signal is partitioned into nine time slots to correspond with nine sets or groupings of sectors that together form a superset, as previously discussed. In one particular embodiment, a particular cell, for example, may generate a pseudo-random integer between 0 and 8, which may then be mapped to a color. Sectors within a cell may be numbered 0, 1, 2 . . . . The color determined pseudo-randomly for the particular cell may, for example, be assigned to sector 0 in this particular embodiment. The other sectors within the cell may then be colored in such a manner that sectors 0, 1, 2, . . . follow the sequential order of $\alpha$, $\beta$, $\gamma$ with wrap around. For examples if sector 0 has $\beta$ assigned as a second element then, sector 1 has $\gamma$ and sector 2 has $\alpha$.

For this particular embodiment, any set of sectors, which represents a color group here, has 1/9 of the total sectors in the average sense. However, for a given realization of the pseudo-random color assignment, a particular set of sectors may have more or less than 1/9 of the sectors. For a static mobile station or receiver, random coloring may be beneficial since dedicated coloring for a static mobile station may result in interference that will generally produce less accurate position location estimates. Of course, by its nature, for random coloring, a cyclic shift, such as described above for a dedicated coloring embodiment, may be omitted.

Previously we discussed an embodiment of an enhanced pilot signal that illustrated features in which the signal waveforms comprise time division multiplexed or TDM signals. In particular, this was discussed in connection with the protocol 1xEV-DO. However, as previously discussed, many other signal dimensions may be employed so that a signal waveform transmitted is mutually orthogonal with other transmitted signal waveforms. For example, and as is well-known, it may be possible for signals to be mutually orthogonal along the frequency dimension, as in the case of frequency division multiplexed (FDM) signals. Likewise, communication systems exist that employ orthogonal frequency divisional multiplexing or OFDM. In this system, signals are modulated so that mutually orthogonal signal waveforms may be transmitted along both the time and frequency dimensions. This particular type of enhanced pilot signal shall be discussed in connection with two examples. One example is in connection with the WiMAX specification and another example is in connection with the LTE specification, both WiMAX and LIE specified hereinafter in more detail in connection with other similar wireless protocols or communications specifications.

In connection with WiMAX, for example, a number of possible approaches for enhanced pilot signaling may be envisioned. One such approach may use the feature that the first OFDM symbol in a downlink sub-frame in WiMAX is used for transmitting a preamble. The preamble is employed for synchronization, initial channel estimation and handoff. Specifically, OFDM symbols may be multiplexed in time and in frequency. Subcarriers in the OFDM symbol of the preamble may be partitioned into three groups of subcarriers, where a group of subcarriers is referred to as a subcarrier set. In a segmented frequency re-use situation, a sector may be assigned to a specific subcarrier set. For example, segmented frequency reuse may correspond to a situation where system bandwidth belongs to one radio frequency carrier and is divided among sectors. In an alternate implementation, a carrier set may still have three subcarriers, and one sector may be assigned to all three subcarriers of one carrier set. A disadvantage of employing preamble pilots for position location as just described is that as a mobile station approaches to a base station, it may provide strong interference to the base station and interfere with the base station's ability to detect other mobiles stations using the same subcarrier sets. In addition, the mobile station is far from the other base stations, and thus the other base stations may have difficulty detecting the mobile station.

WiMax uses a "zones" approach. A "zones" approach refers to a time division multiplexing within a frame. A frame may comprise different zones and zones may have different number of OFDM symbols. The standard allows new zones to be created. Therefore, in one embodiment intended to be compatible with WiMAX, an enhanced pilot signal may be transmitted in a new zone created for position location. As discussed previously for 1xEV-DO, here too overhead may be involved, such as below one percent, since the zone may have a low duty cycle as part of the DL frame.

The zone within a frame, in one embodiment, for example, may be the same for all base stations. Base stations may, therefore transmit PLP (Position Location Pilot) zone information as part of a downlink map information transmitted to receiving mobile stations. For identification purposes, a base station may use one of a set of possible sequences for the position location pilot. For example, Chu sequences, as have been used in other approaches, may be employed. Of course to avoid confusion, different codes should be used to avoid having the position location pilot detected as the preambles or vice-versa.

Within this WiMAX zone approach, color-coding of cells may be handled as an extension of the approach previously described in connection with time division multiplexed signals. Thus, for a given position location zone, one color group of base stations transmit their position location pilots. Different base stations in a group use different sequences for its position location pilot. As illustrated previously for 1xEV-DO, this may be employed with K=3 or K=9, as examples. Likewise, in this manner, incremental detection also may be implemented.

One aspect of employing WiMAX is that enhanced pilot signals may be mutually orthogonal in the frequency and time signal dimensions as a result of the use of OFDM symbols. As illustrated by embodiment 610 in the FIG. 6, for example, $\alpha$ sectors may employ the first PLP zone, $\beta$ sectors may employ the second PLP zone and $\gamma$ sectors may employ the third PLP zone. Therefore, within a PLP zone specified for an $\alpha$ sector, different cell are reflected along the frequency signaling dimension. Likewise, a similar approach occurs for the $\beta$ and $\gamma$ sectors. Here, as before, it remains an option for a mobile station to employ incremental detection. Likewise, as previously described, dedicated "coloring" may be employed, as well as time-varying or random coloring.

One advantage of the latter approach is that modification of the standard is relatively small. Position location pilots/sequences may be defined for different bandwidth deployment scenarios. Likewise, various aspects of the uplink and downlink messages may be defined. For example, a new uplink message for reporting pilot detection results may be added, as well as new downlink messages to communicate neighboring base stations to the terminal. New media access control headers for reporting the results of pilot detection would be desirable to speed up the reporting. Nonetheless, it may be made fully backward compatible with currently planned employments of WiMax. Legacy WiMAX terminals that would not support the enhanced pilot signal approach would in effect ignore the position location pilot zone.

Similarly, the LTE specification may likewise adopt an approach for position location signaling specification similar to the approach previously described for WiMAX. Although there may be potential approaches to enhance presently specified PSC and SSC sequences and symbols to increase energy and, thus, likelihood of detection; nonetheless, there may be advantages to defining a pilot structure similar as that just described in connection with WiMAX involving position location pilots or PLP signaling.

In an embodiment in which dedicated pilots are employed for position location, cells may reserve some fraction of time for a position location pilot within the structure of the signals currently intended for LTE. More specifically, some RBs and some TIs may be employed for a position location pilot. Likewise, for the position location pilot, a cell may use one of 512 Chu sequences for identification purposes. Likewise, a cell may transmit PLPs with time or time-frequency re-use similar to the manner previously described. An example, PLP transmission is described in connection with U.S. patent application Ser. No. 12/113,810, titled "Position Location for Wireless Communications System," filed on May 1, 2008, by Attar et al.; herein incorporated by reference in its entirety and assigned to the assignee of the presently claimed subject matter. Thus, as described previously with WiMAX, re-use, incremental detection, dedicated coloring or random coloring may all be employed depending upon the particular implementation.

In yet another embodiment employing enhanced pilot signals, aspects of such enhanced pilot signals may be configurable, such as, without limitation, whether time slots are employed, which time slots, how frequently enhanced pilot signals are transmitted, etc. For example, in one embodiment, a service operator for a wireless communications system, for example, may specify values for configurable parameters based at least in part on the intended application. For example, mutually orthogonal aspects of transmissions of the signal waveforms are capable of being set to particular values or capable of being modified from particular values.

As alluded to previously, in some embodiments, a hybrid approach to position location may be employed. For example, while an enhanced pilot signal may be employed as part of a wireless communications system, it may be supplemented with other information available via signals received through other mechanism to determine position location. Likewise, determining a position location estimate need not be performed entirely at the mobile unit. It may, for example, include transmitting location information to an outside entity (e.g., a position determination entity).

Although claimed subject matter is not limited in scope in this respect, as one example embodiment, enhanced pilot signals may assist a mobile cell access point, such as, for example, a femto cell home access point, to obtain GPS timing information through access to both the internet and wireless communication signals. For example, assume enhanced pilot signals are available via 1xEV-DO, although, of course, claimed subject matter is not limited in scope to 1xEV-DO, as indicated previously.

A cell access point may receive wireless signals from a base station providing modulo 426.66 ms GPS time offset by a propagation delay. Of course, this received signal has a timing ambiguity from the "modulo" aspect of the signals employed. Likewise, propagation delay is attributable to the time for the signals to reach the access point from the base station. However, for this embodiment, an access point may have the ability to resolve the timing ambiguity and remove the propagation delay to determine GPS time using enhanced pilot signals.

Network time protocol, or NTPv4, for example, may provide a cell access point with UTC time. UTC time may be employed the resolve the ambiguity from the modulo time signal. To estimate and remove propagation delay, the home access point may obtain its own location and the base station location that transmitted the timing signal. These locations may be obtained using enhanced pilot signaling, as previously described. Thus, the access point may compute propagation delay and compensate for it to compute GPS time. Thus, this particular embodiment provides GPS time, but without GPS satellite assistance. In some circumstances, the ability to obtain GPS time without access to the satellite may be desirable.

As previously discussed, enhanced pilot signals may be provided in many forms, such as time segments, frequency bands, or time-frequency bins. In any of these latter examples, partitioning into K groups along one or more signaling dimensions, such as time, frequency, or time-frequency, for example, may be applied so that the partitions are orthogonal or nearly so. Likewise, a superset of sectors may also be partition into K sets or groups. As discussed previously with reference to a particular embodiment, a one-to-one association may be established between the orthogonal or nearly orthogonal partitions and the sector partitions. In such an embodiment, for a particular set of sectors, an enhanced pilot signal may be transmitted with the particular window of the particular one or more signaling dimensions that have been partitioned. Likewise, as discussed previously with reference to a particular embodiment, dedicated coloring or time varying coloring, such as random coloring, may be applied. Therefore, as has been previously discussed and illustrated with respect to particular embodiments, enhanced pilot signaling may be applied to OFDM systems, such as WiMAX, LTE, UMB, or other 4G approaches being developed, for example, by 3GPP or 3GPP2. Of course, again, these are examples and claimed subject matter is intended to cover more than OFDM systems as well.

Therefore, wireless communication or location determination techniques, such as, for example, the embodiments previously described, may be used for a host of various wireless communication networks. Without limitation, these include Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. A CDMA network may implement one or more radio access technologies (RATs) such as cdma2000, Wideband-CDMA (W-CDMA), or Universal Terrestrial Radio Access (UTRA), to name just a few radio technologies. Here, cdma2000 may include technologies implemented according to IS-95, IS-2000, or IS-856 standards. UTRA may include Wideband-CDMA (W-CDMA) or Low Chip Rate (LCR). A TDMA network may implement a radio technology such as Global System for Mobile Communications (GSM). An OFDMA network may implement a radio technology such as Evolved UTRA (E-UTRA), IEEE 802.11, IEEE 802.16 (also referred to as the WiMAX specification), IEEE 802.20, Flash-OFDM®, etc. UTRA, E-UTRA, and GSM are part of Universal Mobile Telecommunication System (UMTS). Long Term Evolution (also referred to as LTE or the LTE specification) is a release of UMTS that may use E-UTRA. UTRA, E-UTRA, GSM, UMTS and LTE are described in documents that may be obtained from the 3rd Generation Partnership Project (3GPP). Cdma2000 is described in documents that may be obtained from the 3rd Generation Partnership Project 2 (3GPP2). 3GPP and 3GPP2 documents are, of course, publicly available.

Figure 7:
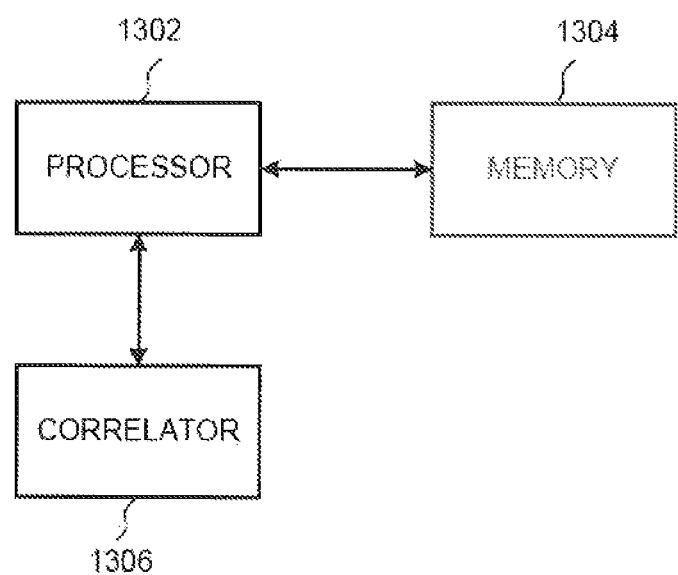
FIG. 7 is a schematic diagram illustrating an embodiment of a system for processing signals.

An example implementation of a system for processing signals is illustrated in FIG. 7. However, this is merely an example of a system that is capable of acquiring signals by processing according to a particular example and other systems may be used without deviating from claimed subject matter. As illustrated in FIG. 7, according to this particular example, such a system may comprise a computing platform including a processor 1302, memory 1304, and correlator 1306. Correlator 1306 may produce correlation functions or operations for signals provided by a receiver (not shown) to be processed by processor 1302, either directly or through memory 1304. Correlator 1306 may be implemented in hardware firmware, software, or any combination. However, this merely an example of how a correlator may be implemented and claimed subject matter is not limited to this particular example.

Here, however, continuing with this example, memory 1304 may store instructions which are accessible and executable by processor 1302. Here, processor 1302 in combination with such instructions may perform a variety of the operations previously described, such as, for example, without limitation, correlating a PN or other sequence.

Figure 8:
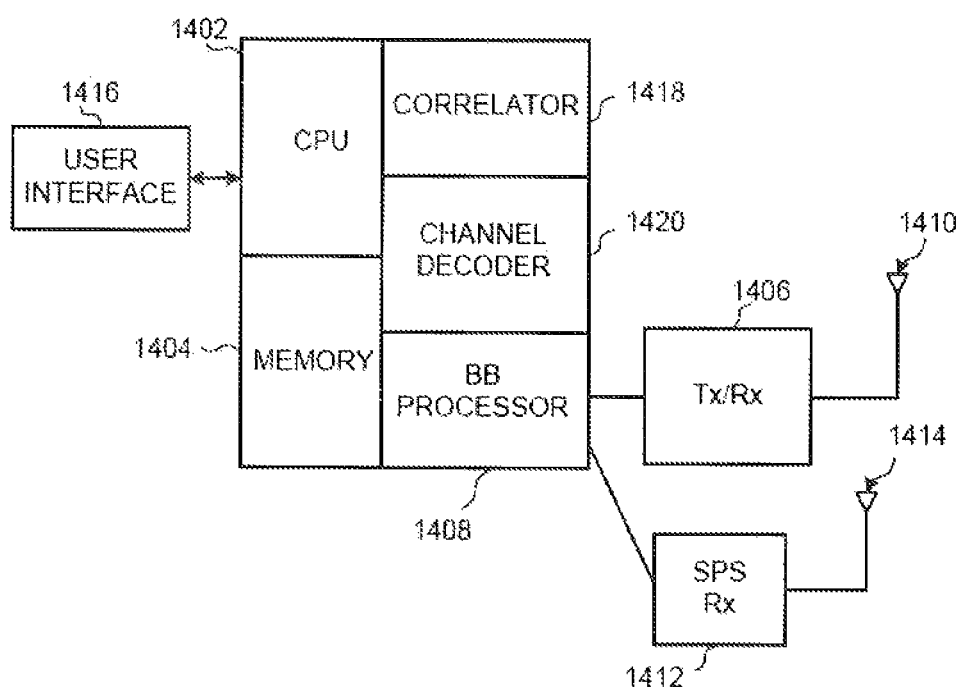
FIG. 8 is a schematic diagram illustrating an embodiment of a mobile station.

Turning to FIG. 8, radio transceiver 1406 may modulate a radio frequency (RF) carrier signal with baseband information, such as voice or data, or demodulate a modulated RF carrier signal to obtain baseband information. Antenna 1410 may transmit a modulated RF carrier or receive a modulated RF carrier, such as via a wireless communications link.

Baseband processor 1408 may provide baseband information from CPU 1402 to transceiver 1406 for transmission over a wireless communications link. Here, CPU 1402 may obtain such baseband information from an input device within user interface 1416. Baseband processor 1408 may also provide baseband information from transceiver 1406 to CPU 1402 for transmission through an output device within user interface 1416. User interface 1416 may comprise a plurality of devices for inputting or outputting user information, such as voice or data. Such devices may include, for example, a keyboard, a display screen, a microphone, or a speaker.

Here, SPS receiver 1412 may receive and demodulate SPS transmissions, and provide demodulated information to correlator 1418. Correlator 1418 may apply correlation functions from information provided by receiver 1412. For a given PN sequence, for example, correlator 1418 may produce a correlation function which may, for example, be applied in accordance with defined coherent and non-coherent integration parameters. Correlator 1418 may also apply pilot-related correlation functions from information relating to pilot signals provided by transceiver 1406. Channel decoder 1420 may decode channel symbols received from baseband processor 1408 into underlying source bits. In one example in which channel symbols comprise convolutionally encoded symbols, such a channel decoder may comprise a Viterbi decoder. In a second example, in which channel symbols comprise serial or parallel concatenations of convolutional codes, channel decoder 1420 may comprise a turbo decoder.

Memory 1404 may store instructions which are executable to perform one or more of processes or implementations, which have been described or suggested previously, for example. CPU 1402 may access and execute such instructions. Through execution of these instructions CPU 1402 may direct correlator 1418 to perform a variety of signal processing related tasks. However, these are merely examples of tasks that may be performed by a CPU in a particular aspect and claimed subject matter in not limited in these respects. It should be further understood that these are merely examples of systems for estimating a position location and claimed subject matter is not limited in these respects.

It will, of course, be understood that, although particular embodiments have just been described, claimed subject matter is not limited in scope to a particular embodiment or implementation. For example, one embodiment may be in hardware, such as implemented to operate on a device or combination of devices, for example, whereas another embodiment may be in software. Likewise, an embodiment may be implemented in firmware, or as any combination of hardware, software, and/or firmware, for example. The methodologies described herein may be implemented by various means depending upon the application. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. For a firmware and/or software implementation, the methodologies may be implemented with modules (e.g., procedures, functions, and so on) that perform the functions described herein. Any machine readable medium tangibly embodying instructions may be used in implementing the methodologies described herein. For example, software codes may be stored in a memory, for example, a memory of a mobile station, and executed by a processor, for example a microprocessor. Memory may be implemented within the processor or external to the processor. As used herein the term "memory" refers to any type of long term, short term, volatile, nonvolatile, or other memory and is not to be limited to any particular type of memory or number of memories, or type of media upon which memory is stored. Likewise, although claimed subject matter is not limited in scope in this respect, one embodiment may comprise one or more articles, such as a storage medium or storage media. This storage media, such as, one or more COD-ROMs and/or disks, for example, may have stored thereon instructions, that if executed by a system, such as a computer system, computing platform, or other system, for example, may result in an embodiment of a method in accordance with claimed subject matter being executed, such as one of the embodiments previously described, for example. As one potential example, a computing platform may include one or more processing units or processors, one or more input/output devices, such as a display, a keyboard and/or a mouse, and/or one, or more memories, such as static random access memory, dynamic random access memory, flash memory, and/or a hard drive.

In the preceding description, various aspects of claimed subject matter have been described. For purposes of explanation, specific numbers, systems and/or configurations were set forth to provide a thorough understanding of claimed subject matter. However, it should be apparent to one skilled in the art having the benefit of this disclosure that claimed subject matter may be practiced without the specific details. In other instances, well known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

The invention claimed is:

1. A method of transmitting signals comprising:
transmitting Position Location Pilot (PLP) signal waveforms from at least two respective sectors, said at least two respective sectors being from at least two different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sectors capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

2. The method of claim 1, wherein said signal dimension comprises at least one of the following signal dimensions: time, frequency, phase, amplitude, spreading code, signal strength or any combinations thereof.

3. The method of claim 2, wherein transmissions of the transmitted signal waveforms have reduced interference relative to transmissions of signal waveforms that are not at least nearly mutually orthogonal at least along a particular signal dimension.

4. The method of claim 3, wherein mutually orthogonal aspects of transmissions of the signal waveforms are capable of being set.

5. The method of claim 3, wherein mutually orthogonal aspects of transmissions of the signal waveforms are capable of being modified.

6. The method of claim 1, wherein signal waveforms transmitted from respective sectors are at least mutually orthogonal at least along a particular signal dimension.

7. The method of claim 1, wherein said sets of sectors comprise non-overlapping sets of said superset of sectors.

8. The method of claim 1, wherein transmitting said signal waveforms comprises transmitting multiple signal waveforms from multiple sectors, said multiple sectors being from different sets of a superset of sectors, the transmitted signal waveforms comprising time division multiplexed (TDM) signal waveforms.

9. The method of claim 8, wherein said TDM signal waveforms comprise highly detectable pilot (HDP) signals transmitted in dedicated time slots associated with particular cell sectors.

10. The method of claim 8, wherein said TDM signal waveforms comprise highly detectable pilot (HDP) signals transmitted in time slots pseudo randomly associated with particular cell sectors.

11. The method of claim 1, wherein transmitting said signal waveforms comprises transmitting multiple signal waveforms from multiple sectors, said multiple sectors being from different sets of a superset of sectors, the transmitted signal waveforms comprising frequency divisional multiplexed (FDM) signal waveforms.

12. The method of claim 11, wherein said FDM signal waveforms comprise highly detectable pilot (HDP) signals transmitted at frequencies pseudo randomly associated with particular cell sectors.

13. The method of claim 11, wherein said FDM signal waveforms comprise highly detectable pilot (HDP) signals transmitted at dedicated frequencies associated with particular cell sectors.

14. The method of claim 1, wherein transmitting said signal waveforms comprises transmitting multiple signal waveforms from multiple sectors, said multiple sectors being from different sets of a superset of sectors, the transmitted signal waveforms comprising OFDM signal waveforms.

15. The method of claim 14, wherein said OFDM signal waveforms comprise highly detectable pilot (HDP) signals transmitted at frequencies and/or in time slots pseudo randomly associated with particular cell sectors.

16. The method of claim 14, wherein said OFDM signal waveforms comprise highly detectable pilot (HDP) signals transmitted at dedicated frequencies and/or in dedicated time slots associated with particular cell sectors.

17. A method of receiving signals at a position location comprising:
receiving at least two respective Position Location Pilot (PLP) signal waveforms having been transmitted from at least two respective sectors, said at least two respective sectors being from different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sectors capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

18. The method of claim 17, wherein signal waveforms transmitted from respective sectors are at least mutually orthogonal at least along a particular signal dimension.

19. The method of claim 17, wherein said sets of sectors comprise non-overlapping sets of said superset of sectors.

20. The method of claim 17, wherein said signal dimension comprises at least one of the following signal dimensions: time, frequency, phase, amplitude, spreading code, signal strength or any combinations thereof.

21. The method of claim 20, wherein transmissions of the transmitted signal waveforms have reduced interference relative to transmissions of signal waveforms that are not at least nearly mutually orthogonal at least along a particular signal dimension.

22. The method of claim 21, and further comprising processing said received signal waveforms to estimate a position location of the receiver receiving the signal waveforms.

23. The method of claim 22, wherein receiving said signal waveforms comprises receiving multiple signal waveforms having been transmitted from multiple sectors, said multiple sectors being from different sets of a superset of sectors, the transmitted signal waveforms comprising time division multiplexed (TDM) signal waveforms.

24. The method of claim 23, wherein said TDM signal waveforms comprise highly detectable pilot (HDP) signals transmitted in dedicated time slots associated with particular cell sectors.

25. The method of claim 23, wherein said TDM signal waveforms comprise highly detectable pilot (HDP) signals transmitted in time slots pseudo randomly associated with particular cell sectors.

26. The method of claim 22, wherein said signal waveforms comprise multiple signal waveforms from multiple sectors, said multiple sectors being from different sets of a superset of sectors, the transmitted signal waveforms comprising frequency divisional multiplexed (FDM) signal waveforms.

27. The method of claim 26, wherein said FDM signal waveforms comprise highly detectable pilot (HDP) signals transmitted at dedicated frequencies associated with particular cell sectors.

28. The method of claim 26, wherein said FDM signal waveforms comprise highly detectable pilot (HDP) signals transmitted at frequencies pseudo randomly associated with particular cell sectors.

29. The method of claim 22, wherein said signal waveforms comprise multiple signal waveforms from multiple sectors, said multiple sectors being from different sets of a superset of sectors, the signal waveforms comprising OFDM signal waveforms.

30. The method of claim 29, wherein said OFDM signal waveforms comprise highly detectable pilot (HDP) signals transmitted at dedicated frequencies and/or in dedicated time slots associated with particular cell sectors.

31. The method of claim 29, wherein said OFDM signal waveforms comprise highly detectable pilot (HDP) signals transmitted at frequencies and/or time slots pseudo randomly associated with particular cell sectors.

32. The method of claim 22, wherein said at least one signal dimension comprises time; and further comprising: more accurately estimating the position location of the receiver by processing additional transmitted signal waveforms received by the receiver after said multiple signal waveforms.

33. The method of claim 32, wherein said at least one signal dimension includes a second signal dimension, said second signal dimension comprising frequency.

34. The method of claim 21, wherein mutually orthogonal aspects of transmissions of the signal waveforms are capable of being set.

35. The method of claim 21, wherein mutually orthogonal aspects of transmissions of the signal waveforms are capable of being modified.

36. The method of claim 17, and further comprising transmitting position location information to a PDE based, at least in part, on said received signal waveforms.

37. A method of reducing interference between signal transmissions, said method comprising:
emanating signal transmissions from a variety of locations, the signal transmissions being nearly mutually orthogonal along a particular signal dimension, said locations being partitioned into a distinct number of sets, wherein each set includes a plurality of locations having one of a plurality of Position Location Pilot (PLP) signal waveforms associated with the same particular signal dimension, wherein each set includes a plurality of sectors having a signal waveform associated with the same particular signal dimension, and wherein said plurality of sectors are assigned a plurality of respective PLP zones, each of the sectors capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

38. The method of claim 37, wherein the signal transmissions are nearly mutually orthogonal along at least one of the following signal dimensions: time, frequency, phase, amplitude, spreading code, signal strength or any combinations thereof.

39. The method of claim 37, wherein the signal transmissions are mutually orthogonal along at least one signal dimension.

40. The method of claim 39, wherein the signal transmissions are mutually orthogonal along at least one of the following signal dimensions: time, frequency, phase, amplitude, spreading code, or any combinations thereof.

41. The method of claim 40, wherein mutually orthogonal aspects of the signal transmissions are capable of being set.

42. The method of claim 40, wherein mutually orthogonal aspects of the signal transmissions are capable of being modified.

43. An apparatus comprising:
a signal transmitter arranged to emanate transmissions of Position Location Pilot (PLP) signal waveforms from a location, the signal transmissions to be emanated in a manner to produce nearly mutually orthogonal along a particular signal dimension with signal transmission emanating from one or more other locations, said locations being partitioned into a distinct number of sets, wherein each set includes a plurality of locations having a signal waveform associated with the same particular signal dimension, and wherein said plurality of locations are assigned a plurality of PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

44. The apparatus of claim 43, wherein the signal transmissions to be emanated are nearly mutually orthogonal along at least one of the following signal dimensions: time, frequency, phase, amplitude, spreading code, signal strength or any combinations thereof.

45. A mobile station comprising:
a receiver operable to process at least two respective Position Location Pilot (PLP) signal waveforms having been transmitted from at least two respective sectors, said at least two respective sectors being from different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

46. The mobile station of claim 45, wherein said signal dimension comprises at least one of the following signal dimensions: time, frequency, phase, amplitude, spreading code, signal strength or any combinations thereof.

47. The mobile station of claim 46, wherein transmissions of the transmitted signal waveforms have reduced interference relative to transmissions of signal waveforms that are not at least nearly mutually orthogonal at least along a particular signal dimension.

48. An apparatus comprising: a transmitter arranged to transmit Position Location Pilot (PLP) signal waveforms from at least one sector location, the transmitted signal waveforms comprising signal waveforms at least nearly mutually orthogonal at least along a particular signal dimension with signal waveforms to be transmitted from one or more other sector locations, said at least two respective sector locations being from at least two different sets of a superset of sector locations, wherein each set includes a plurality of sectors having a signal waveform associated with the same particular signal dimension, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

49. The apparatus of claim 48, wherein said signal dimension of the signal waveforms to be transmitted comprises at least one of the following signal dimensions: time, frequency, phase, amplitude, spreading code, signal strength or any combinations thereof.

50. The apparatus of claim 49, wherein transmissions of the to be transmitted signal waveforms have reduced interference relative to transmissions of signal waveforms that are not at least nearly mutually orthogonal at least along a particular signal dimension.

51. An apparatus comprising:
means for transmitting Position Location Pilot (PLP) signals-waveforms; said means for transmitting signals arranged to emanate signal transmissions from a location, said means for transmitting signals comprising means for producing nearly mutually orthogonal signal transmissions along a particular signal dimension with signal transmissions from one or more other locations, said locations being partitioned into a distinct number of sets, wherein each set includes a plurality of locations having a signal waveform associated with the same particular signal dimension, and wherein said plurality of locations are assigned a plurality of PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

52. The apparatus of claim 51, wherein the signal transmissions are nearly mutually orthogonal along at least one of the following signal dimensions: time, frequency, phase, amplitude, spreading code, signal strength or any combinations thereof.

53. A mobile station comprising:
means for receiving at least two respective Position Location Pilot (PLP) signal waveforms and means for processing said at least two respective signal waveforms, said at least two respective signal waveforms having been transmitted from at least two respective sectors, said at least two respective sectors being from different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

54. The mobile station of claim 53 wherein said signal dimension comprises at least one of the following signal dimensions: time, frequency, phase, amplitude, spreading code, signal strength or any combinations thereof.

55. The mobile station of claim 54, wherein transmissions of the transmitted signal waveforms have reduced interference relative to transmissions of signal waveforms that are not at least nearly mutually orthogonal at least along a particular signal dimension.

56. An apparatus comprising:
means for transmitting Position Location Pilot (PLP) signals-waveforms;
said means for transmitting signals arranged to transmit signal waveforms from at least one sector location, the transmitted signal waveforms comprising signal waveforms at least nearly mutually orthogonal at least along a particular signal dimension with signal waveforms to be transmitted from one or more other sector locations, said sector locations being from at least two different sets of a superset of sector locations, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

57. The apparatus of claim 56, wherein transmissions of the transmitted signal waveforms have reduced interference relative to transmissions of signal waveforms that are not at least nearly mutually orthogonal at least along a particular signal dimension.

58. A non-transitory machine-readable storage medium comprising instructions that, if executed, direct a computing platform to transmit Position Location Pilot (PLP) signal waveforms from at least two respective sectors, said at least two respective sectors being from at least two different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

59. The non-transitory machine-readable storage medium of claim 58, wherein said signal dimension to comprises at least one of the following signal dimensions: time, frequency, phase, amplitude, spreading code, signal strength or any combinations thereof.

60. The non-transitory machine-readable storage medium of claim 59, wherein transmissions of the transmitted signal waveforms to have reduced interference relative to transmissions of signal waveforms that are not at least nearly mutually orthogonal at least along a particular signal dimension.

61. A non-transitory machine-readable storage medium comprising instructions that, if executed, direct a computing platform to process at least two respectively received Position Location Pilot (PLP) signal waveforms having been transmitted from at least two respective sectors, said at least two respective sectors being from different sets of a superset of sectors, the transmitted signal waveforms comprising signal waveforms at least nearly mutually orthogonal at least along a particular signal dimension, wherein each set includes a plurality of sectors having a signal waveform associated with the same particular signal dimension, and wherein said plurality of sectors are assigned a plurality of respective PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

62. The non-transitory machine-readable storage medium of claim 61, wherein said signal dimension to comprise at least one of the following signal dimensions: time, frequency, phase, amplitude, spreading code, signal strength or any combinations thereof.

63. The non-transitory machine-readable storage medium of claim 62, wherein transmissions of the transmitted signal waveforms to have reduced interference relative to transmissions of signal waveforms that are not at least nearly mutually orthogonal at least along a particular signal dimension.

64. A non-transitory machine-readable storage medium comprising instructions that, if executed, direct a transmitter to transmit from a location signal transmissions carrying Position Location Pilot (PLP) signal waveforms nearly mutually orthogonal along a particular signal dimension with signal transmissions to be transmitted from one or more other locations, said locations being partitioned into a distinct number of sets, wherein each set includes a plurality of locations having a signal waveform associated with the same particular signal dimension, and wherein said plurality of locations are assigned a plurality of PLP zones, each of the sets capable of re-using at least one segment of said signal dimension, wherein the PLP signal waveforms are transmitted in bursts in predetermined time slots within each of a plurality of time frames, and wherein each of the PLP signal waveforms occupies a different time slot within each of two immediately adjacent time frames.

65. The non-transitory machine-readable storage medium of claim 64, wherein the signal transmissions to be nearly mutually orthogonal along at least one of the following signal dimensions: time, frequency, phase, amplitude, spreading code, signal strength or any combinations thereof.

\* \* \* \* \*